(12) United States Patent
Weinmann

(10) Patent No.: US 6,975,495 B2
(45) Date of Patent: Dec. 13, 2005

(54) CIRCUIT CONFIGURATION AND METHOD FOR MEASURING AND LIMITING CURRENTS

(75) Inventor: Martin Weinmann, Bad Waldsee (DE)

(73) Assignee: Diehl AKO Stiftung & Co. KG, Munich (DE)

( * ) Notice: Subject to any disclaimer, the term of this patent is extended or adjusted under 35 U.S.C. 154(b) by 343 days.

(21) Appl. No.: 10/352,681

(22) Filed: Jan. 28, 2003

(65) Prior Publication Data

US 2003/0141874 A1    Jul. 31, 2003

(30) Foreign Application Priority Data

Jan. 31, 2002  (DE) ................. 102 03 813

(51) Int. Cl.[7] .............................................. H02H 9/04
(52) U.S. Cl. .................................................. 361/93.1
(58) Field of Search .................... 361/58, 93.7, 93.1; 363/37; 324/601, 691

(56) References Cited

U.S. PATENT DOCUMENTS 5,258,738 A * 11/1993 Schat ........................ 338/332
6,111,766 A *  8/2000 Chang et al. ................. 363/79
6,313,977 B1 * 11/2001 Hauer ......................... 361/140

FOREIGN PATENT DOCUMENTS

| DE | 90 15 206.9 U1 | 2/1991 |
| DE | 43 39 551 C1 | 10/1994 |
| DE | 198 34 315 A1 | 2/2000 |
| DE | 198 38 974 A1 | 3/2000 |
| DE | 100 13 345 A1 | 10/2001 |

* cited by examiner

*Primary Examiner*—Brian Sircus
*Assistant Examiner*—Boris Benenson
(74) *Attorney, Agent, or Firm*—Laurence A. Greenberg; Werner H. Stemer; Ralph E. Locher

(57) ABSTRACT

A circuit configuration and a method for determining a current drawn from a mains by a converter through a dc voltage intermediate circuit, replaces a required pulse-resistant input current measuring resistor with a conductor track of the circuit configuration itself. Since the input current drawn from the mains by the dc voltage intermediate circuit is on average equal to the output current delivered to the converter, the present resistance of the conductor track is given by the resistance of the measuring resistor downstream of the dc voltage intermediate circuit, weighted with the quotient of the input and output voltage drops. In that way, the mains current and therewith the power factor can be influenced by way of a current limiter without requiring an expensive pulse-resistant special resistor for mains current measurement.

6 Claims, 1 Drawing Sheet

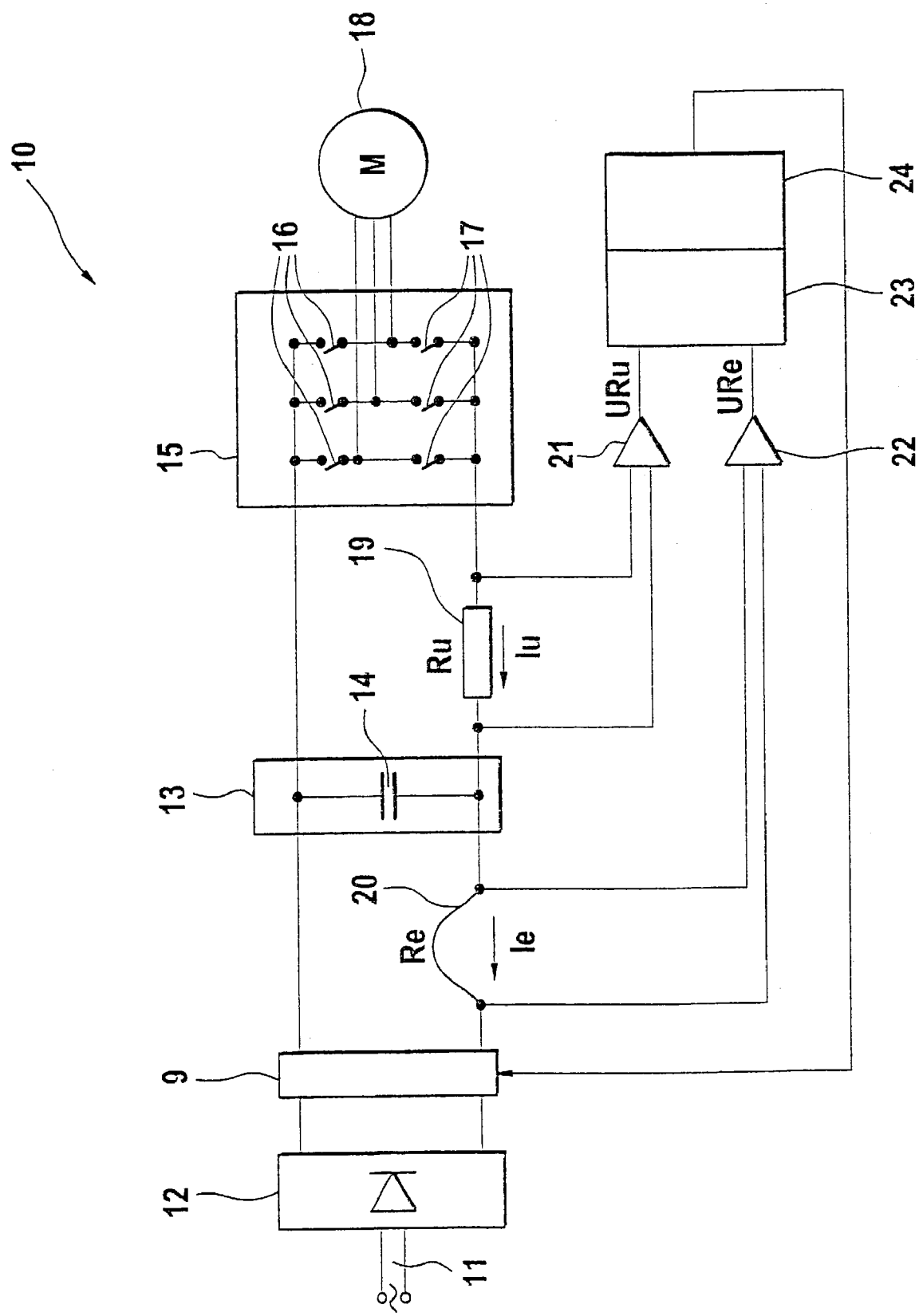

CIRCUIT CONFIGURATION AND METHOD FOR MEASURING AND LIMITING CURRENTS

BACKGROUND OF THE INVENTION

Field of the Invention

The invention relates to a circuit configuration for ascertaining a current drawn by a converter through a dc voltage intermediate circuit having measuring resistors upstream and downstream of the dc voltage intermediate circuit. The invention also relates to a method of ascertaining an input current drawn by a converter through a dc voltage intermediate circuit, through the use of voltage measurement at measuring resistors upstream and downstream of the dc voltage intermediate circuit. The input current upstream of the dc voltage intermediate circuit is determined as a quotient of a voltage drop and a magnitude of the input current measuring resistor.

A circuit configuration of that kind is known from FIG. 6 of German Published, Non-prosecuted Patent Application DE 198 34 315 A1, corresponding to U.S. patent application Ser. No. 09/363,866. The circuit configuration shown therein substantially includes a rectifier bridge connected to the mains, a dc voltage intermediate circuit and a six-pulse converter which is fed therefrom and feeds a three-phase motor. In addition, a respective measuring resistor is disposed between the rectifier bridge and the dc voltage intermediate circuit as well as between the latter and the converter. The last, downstream measuring resistor measures the converter current from the dc voltage intermediate circuit and the upstream measuring resistor measures the input current drawn from the mains.

The input current which is ascertained at the upstream measuring resistor can serve as a regulating parameter, for active control of the current drawn from the mains, through the use of a current limiter circuit. That makes it possible to reduce the effective current, improve the power factor (referred to as power factor control or PFC) and limit the power drawn from the mains to a maximum value which, in spite of a momentarily relatively high current demand, still does not cause a mains fuse protection to trip. Since that measuring resistor must be constructed in such a way that it withstands and remains undamaged during high current peaks, particularly when charging up a discharged intermediate circuit capacitor, it is necessary to use a pulse-resistant resistor in that case. The pulse-resistant resistor has a very high individual item cost and by virtue of its dimensions is usually not suitable for automatic equipment in a circuit configuration.

SUMMARY OF THE INVENTION

It is accordingly an object of the invention to provide a circuit configuration and a method for measuring and limiting currents, which overcome the hereinafore-mentioned disadvantages of the heretofore-known devices and methods of this general type, which measure a mains current received from a converter through a dc voltage intermediate circuit and which make it possible to forego the use of a special pulse-resistant resistor.

With the foregoing and other objects in view there is provided, in accordance with the invention, a circuit configuration for ascertaining a current. The circuit configuration comprises a dc voltage intermediate circuit. A converter receives the current to be ascertained, from the dc voltage intermediate circuit. An output current measuring resistor is disposed downstream of the do voltage intermediate circuit. An input current measuring resistor is disposed upstream of the dc voltage intermediate circuit and is a conductor track of the circuit configuration.

In accordance with another feature of the invention, a conventional resistor such as, for example, an SMD thick-film resistor, is still used as the output current measuring resistor, downstream of the dc voltage intermediate circuit. With the objects of the invention in view, there is also provided a method of ascertaining an input current, which comprises providing a dc voltage intermediate circuit, a converter receiving the input current to be ascertained, from the dc voltage intermediate circuit, an input current measuring resistor upstream of the dc voltage intermediate circuit, and a known output current measuring resistor downstream of the dc voltage intermediate circuit, defining an output voltage drop across the output current measuring resistor. An input current upstream of the dc voltage intermediate circuit is determined as a quotient of an input voltage drop across the input current measuring resistor and a magnitude of the input current measuring resistor. The magnitude of the input current measuring resistor is determined by evaluating the known output current measuring resistor with a quotient of a currently measured period mean value of the input voltage drop and the output voltage drop.

Therefore, the method of ascertaining the mains current which is obtained by way of a dc voltage intermediate circuit is based on voltage measurement at measuring resistors upstream and downstream of the dc voltage intermediate circuit. Since the intermediate circuit capacitor on average delivers as much charge to the converter as it has previously received from the mains, the input current upstream and the output current downstream of the dc voltage intermediate circuit are on average the same. They can be described in accordance with Ohm's law by voltage and resistance. Accordingly, the initially indeterminate magnitude of the input current measuring resistor is determined from the known magnitude of the output current measuring resistor multiplied by the quotient of the measured voltages at the input current measuring resistor and at the output current measuring resistor. If measurement of the voltages at the two measuring resistors is implemented continuously or quasi-continuously, it is possible to ascertain a present period mean value therefrom.

The input current being ascertained is a measurement with respect to the current consumption from the mains. It can be influenced by way of a current limiter and can thus regulate the power factor without requiring an expensive pulse-resistant special resistor for mains current measurement.

Other features which are considered as characteristic for the invention are set forth in the appended claims.

Although the invention is illustrated and described herein as embodied in a circuit configuration and a method for measuring and limiting currents, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The figure of the drawing is a schematic and block diagram of a circuit configuration according to the invention.

DESCRIPTION OF THE PREFERRED EMBODIMENTS

Referring now in detail to the single figure of the drawing, there is seen a simplified topology of a circuit configuration 10 according to the invention for active power factor correction by control of current consumption from a mains 11. An intermediate circuit capacitor 14, disposed in a dc voltage intermediate circuit 13, is charged by way of a rectifier bridge 12 which is connected to the mains 11. A rotating-field motor 18 connected downstream of a converter 15 is fed with power from the capacitor 14, in accordance with an actuation of switching devices 16 and 17 in halfbranches of the converter 15, and the intermediate circuit capacitor 14 is correspondingly discharged. The intermediate circuit capacitor 14 is re-charged from the mains 11 by way of the rectifier bridge 12.

The current from the dc voltage intermediate circuit 13 flows by way of a measuring resistor 19 to the converter 15. The operation of ascertaining the current is implemented at the output current measuring resistor 19, which has a known magnitude or value Ru, by measuring a voltage drop URu. An upstream measuring resistor 20 is connected between the dc voltage intermediate circuit 13 and the rectifier bridge 12 for measuring an input current Ie. The input current Ie which is ascertained in this case can be used for controlling mains current consumption for recharging the intermediate circuit capacitor 14, by way of a current limiter circuit 9.

The input current measuring resistor 20 upstream of the dc voltage intermediate circuit 13 is a conductor track or path of the circuit 10 itself, at which a voltage drop URe is measured. A quotient of that voltage drop URe and a magnitude or value Re of the input current measuring resistor 20 supplies the input current Ie.

The small voltage drops URu and URe which are respectively taken off at the measuring resistors 19 and 20 are amplified by respective amplifiers 21 and 22 to a processing level for an analog-to-digital converter 23 which thus feeds a control device 24 that controls the current limiter 9. The control device 24 is, for example, a microcontroller.

The current drawn from the mains 11 is limited through the use of the circuit 9 in dependence on the measured voltage drop URe between the dc voltage intermediate circuit 13 and the rectifier bridge 12. In this way, a power factor is improved as a consequence of damping harmonics by a sinusoidal current consumption or in the case of an extreme mains impedance the effective current consumption from the mains 11 is limited to a fuse-specific reference value.

In order to determine the magnitude or value Re of the input current measuring resistor 20 which, by virtue of being in the form of a conductor track or path, is not clearly determined and is not constant, and in order to thereby compensate for errors which are caused by film thickness tolerances for the conductor track, non-unitary temperature coefficients, oxidation and so forth, measurement of the voltage drop URe is effected at least quasi-continuously, and likewise with the measurement of the voltage drop URu at the output current measuring resistor 19. The integral mean values of the voltage drop at the measuring resistors 19 and 20 are ascertained from those measurements during a mains period which is given by the reciprocal value of the mains frequency.

The method of current measurement makes use of the fact that a charge flowing by way of the input current measuring resistor 20, for charging up the intermediate circuit capacitor 14, upon the subsequent discharge thereof for feeding the converter 15, flows away again at an identical magnitude by way of the output current measuring resistor 19. As a consequence of this, the mean value of the current flow Ie through the input current measuring resistor 20 during a mains period is equal to the mean value of a current flow Iu through the output current measuring resistor 19 during a mains period.

In accordance with Ohm's law, the period mean value of the respective current flow Ie and Iu through one of the respective measuring resistors 19 and 20 is described by the quotient of the mean value of the respective input voltage drop URe and output voltage drop URu at the respective measuring resistors 20 and 19 during a mains period and the magnitude Re and Ru of the respective measuring resistors 20 and 19.

As stated above, the voltage drop URe and URu is measured at the measuring resistors 20 and 19. The magnitude Ru of the output current measuring resistor 19 is also known. However, it is necessary to ascertain the indeterminate value Re of the input current measuring resistor 20 for the purposes of measuring the current flow Ie. That is effected by evaluation of the magnitude Ru of the output current measuring resistor 19 with the quotient of currently measured period mean values of the input voltage drop URe at the measuring resistor 20 and the output voltage drop URu at the measuring resistor 19.

Preferably, the voltage drop at the two measuring resistors 19 and 20 is measured continuously. It is possible to regulate the current consumption from the mains 11 by way of the current limiter 9 or by way of the motor power limitation by means of converter 15, in dependence on the measured input voltage drop URe between the dc voltage intermediate circuit 13 and the rectifier bridge 12.

An SMD thick-film resistor which can be inserted without any difficulty can be used as the output current measuring resistor 19 for measuring the output voltage drop URu downstream of the dc voltage intermediate circuit 13.

Therefore, in accordance with the invention, a circuit configuration 10 for determining the current Ie drawn from the mains 11 by a converter 15 through a dc voltage intermediate circuit 13 replaces the pulse-resistant input current measuring resistor 20, which is necessary anyway, with a conductor track or path of the circuit configuration itself. Since the input current Ie drawn from the mains 11 by the dc voltage intermediate circuit 13 is on average equal to the output current Iu delivered to the converter 15, the present resistance Re of the conductor track is given by the resistance Ru of the measuring resistor 19 downstream of the dc voltage intermediate circuit 13, weighted with the quotient URe/URu of the input and output voltage drop. In that way, the mains current and therewith the power factor can be influenced by way of a current limiter 9 without requiring an expensive pulse-resistant special resistor for mains current measurement.

I claim:

1. A method of ascertaining an input current, which comprises:

providing a dc voltage intermediate circuit;

providing a converter receiving the input current to be ascertained, from the dc voltage intermediate circuit;

providing an input current measuring resistor upstream of the dc voltage intermediate circuit;

providing a known output current measuring resistor downstream of the dc voltage intermediate circuit, defining an output voltage drop across the output current measuring resistor;

determining an input current upstream of the dc voltage intermediate circuit as a quotient of an input voltage drop across the input current measuring resistor and a magnitude of the input current measuring resistor; and determining the magnitude of the input current measuring resistor by evaluating the known output current measuring resistor with a quotient of a currently measured period mean value of the input voltage drop and the output voltage drop.

2. The method according to claim 1, which further comprises measuring the voltage drop at both of the current measuring resistors at least quasi-continuously.

3. The method according to claim 2, which further comprises:

providing a rectifier bridge receiving current from a mains;

providing a limiter circuit between the rectifier bridge and the dc voltage intermediate circuit; and limiting current consumption from the mains with the limiter circuit in dependence on the measured voltage drop between the dc voltage intermediate circuit and the rectifier bridge, for improving a power factor as a consequence of damping harmonics by sinusoidal current consumption and limiting an effective current consumption from the mains to a fuse-specific reference value in the case of extreme mains impedance.

4. The method according to claim 3, which further comprises ascertaining the output voltage drop through the use of a current flowing from the dc voltage intermediate circuit to the converter, with an SMD thick-film resistor.

5. The method according to claim 1, which further comprises carrying out the step of determining the magnitude of the input current measuring resistor by multiplying the magnitude of the known output current measuring resistor by a quotient of measured voltages at the input current measuring resistor and at the output current measuring resistor.

6. The method according to claim 2, which further comprises limiting current consumption from the mains by limiting the motor power if the effective mains current consumption exceeds the limit of a fuse-specific reference value.

* * * * *